United States Patent [19]

Delagrange et al.

[11] 4,025,848
[45] May 24, 1977

[54] WAVEFORM COMPARING PHASEMETER

[75] Inventors: Arthur D. Delagrange, Sykesville; Cabell Nicholas Pryor, Jr., Silver Spring, both of Md.

[73] Assignee: The United States of America as represented by the Secretary of the Navy, Washington, D.C.

[22] Filed: Sept. 11, 1975

[21] Appl. No.: 612,409

[52] U.S. Cl. ............................. 324/83 D; 324/83 A
[51] Int. Cl.² ........................................ G01R 25/00
[58] Field of Search ....... 328/134; 324/83 A, 83 D, 324/140 R, 140 D

[56] References Cited
UNITED STATES PATENTS

| | | | |
|---|---|---|---|
| 3,263,066 | 7/1966 | Seegmiller | 324/83 D |
| 3,296,581 | 1/1967 | Waruer | 324/83 A |
| 3,414,816 | 12/1968 | Tobey et al. | 324/83 A |
| 3,619,058 | 11/1971 | Hewlett | 324/83 R |
| 3,854,117 | 12/1974 | Fothergill | 324/83 A |

Primary Examiner—Rudolph V. Rolinec
Assistant Examiner—Michael J. Tokar
Attorney, Agent, or Firm—R. S. Sciascia; A. L. Branning; R. E. Bushnell

[57] ABSTRACT

An electrical circuit for measuring the phase difference between a pair of input signals by uniformly limiting selected properties of the waveforms describing the input signals and modulating an output signal in dependence upon the duration of contrariety between the unlimited properties of the input signals whereby error in the output signal due to "jitter" (i.e., abrupt, spurious variations in pulse amplitude or duration caused by superimposition of noise) is substantially eliminated. Various output means produce either a continuous wave analog signal or a digital bit signal in dependence upon the modulation of the output signal. Coupled ancillary circuitry monitors one input signal in comparison with the other input signal and provides an output signal signifying which input signal has a leading phase angle.

16 Claims, 2 Drawing Figures

WAVEFORM COMPARING PHASEMETER

BACKGROUND OF THE INVENTION

This invention relates to electrical circuits designed to measure phase difference between two waveforms and more particularly to circuits wherein noise accompanying input signals is prevented from influencing modulation of the output signal.

Prior art phasemeters use a set-reset bistable multivibrator to measure the absence of coincidence between sequential pulses respectively corresponding to polarity changes by the input signals. Typically, such circuits use parallel clipper and pulsegenerator series circuits to transform the input signals into parallel pulse trains which set and reset the multivibrator. The output of the multivibrator is averaged by a filter to give an output signal dependent in value upon the phase difference as made manifest by the extent of coincidence between parallel pulses.

It is well known in the art that the inability of pulse generators to uniformily produce coincident parallel pulses and the unpredictability of a multivibrator in responding to coincident set and reset pulses causes the output of a multivibrator to erratically shift between the "0" and "1" states for successive periods, even though the input signals have remained in phase. The presence of noise aggravates this problem by causing "jitter", abrupt, spurious variations in waveform amplitude or duration. Consequently as the multivibrator output is averaged in this type of circuit, the output signal will indicate some angle of phase difference when the input signals are in-phase or slightly out-of-phase, thereby rendering the measurement unreliable.

A second disadvantage of prior art circuitry lies in the possibility that the presence of a small amount of noise will cause an extra zero-crossing in one of the input signal waveforms. An extra zero-crossing at the trailing edge of a square wave for example, will be perceived by a pulse-generator as an extra leading edge. Consequently, the multivibrator will be set (or reset) once too often, thereby giving an erroneous output signal.

SUMMARY OF THE INVENTION

The present invention overcomes the disadvantages, inconveniences and limitations of the prior art by providing an improved circuit for measuring phase difference between two periodic and symmetric input signals. Circuits embodying the invention first limit and then compare amplitudes of the input signals, generating an output signal modulated in correspondence to the duration of phase contrariety. A coupled ancilliary circuit provides an output signal signifying lead or lag between the input signals by comparing the coincidence of a pulse generated in response to a substantial change in amplitude by one of the clipped input signals (e.g. a "zero crossing") with the duration of amplitude contrariety.

It is therefore an object of the present invention to provide a circuit for developing an output signal having a magnitude proportioned by the extent of phase difference between two input signals.

It is another object of this invention to provide a circuit for modulating an output signal in dependence upon the phase difference between two input signals.

It is also an object of this invention to provide a circuit for measuring phase difference between input signals by first uniformily limiting selected characteristics of the waveforms describing the input signals and modulating an output signal in dependence upon the duration of contrariety between the unlimited characteristics of the waveforms.

It is a further object of this invention to provide a circuit for measuring phase difference in a pair of input signals by first respectively converting the input signals into geometrically similar waveforms and then developing an output signal dependent upon the duration of contrariety between equivalent geometric characteristics of the waveforms.

It is a still further object of this invention to provide a circuit capable of developing an output signal indicative of whether one input signal leads or lags a second input signal.

One advantage of circuits embodying the present invention lies in the provision of an output signal that is free from ambiguity when the input waveforms are in-phase.

Another advantage of circuits embodying the present invention lies in their ability to substantially eliminate the influence of noise upon the determination of the value of the output signal.

Still another advantage of circuits embodying the present invention lies in their ability to provide an output signal having a value that is dependent upon the phase difference between a pair of input signals and substantially independent of the influence of noise.

A more complete appreciation of this invention and many of the attendent advantages thereof will be readily appreciated as the same becomes better understood by reference to the following detailed description when considered in connection with the accompanying drawings wherein.

DESCRIPTION OF THE PREFERRED EMBODIMENT

Figure 1:
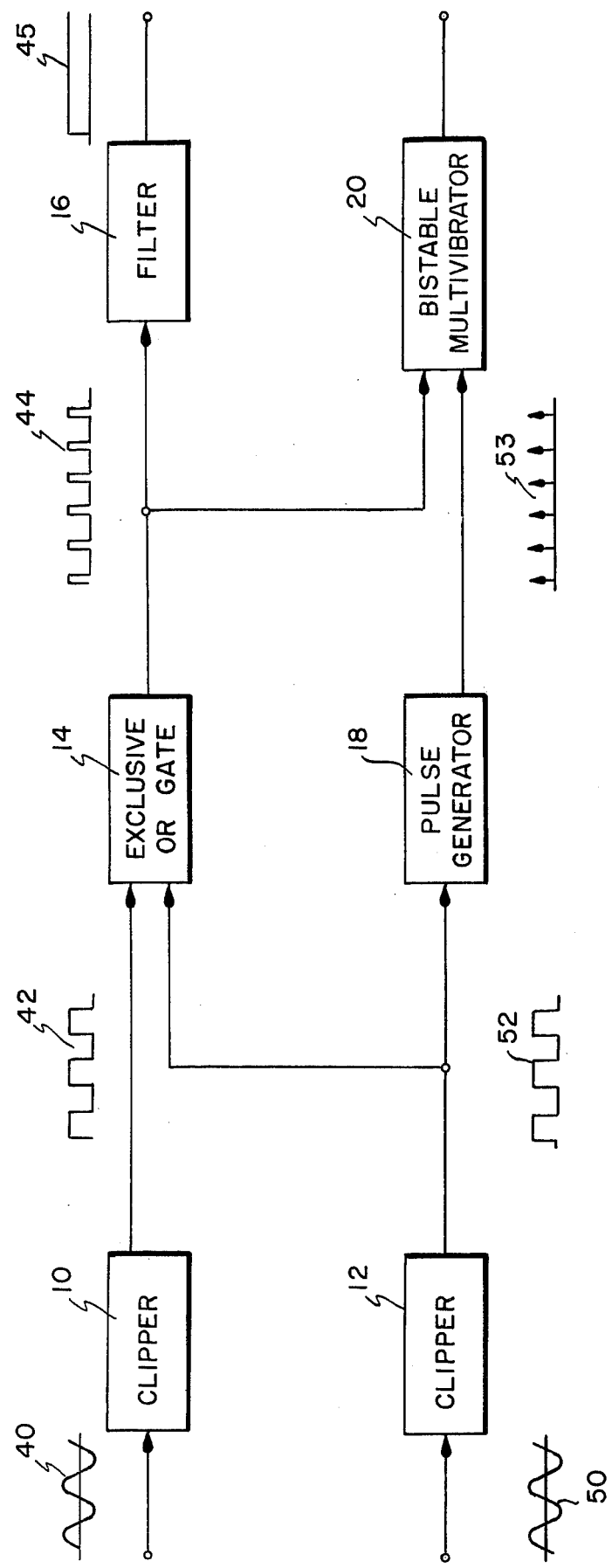
FIG. 1 is a diagrammatic view of a circuit for measuring phase difference and providing output signals indicative of the phase difference between the input signals and signifying whether one input signal leads or lags another input signal.

Referring now to the drawings wherein like reference characters designate identical or corresponding parts throughout the several views, and more particularly in FIG. 1 wherein a diagram of a circuit embodying the invention is shown. Integrated circuit clippers 10, 12 respectively receive and limit the amplitude of their respective input signals 40, 50 to a predetermined value. As shown input signal 40 leads input signal 50. Although the clippers may limit the amplitude of the input signals 40, 50 to any predetermined value, design convenience suggests that the selected value be equal to the output voltage of an accompanying power supply. The resulting intermediate signals 42, 52 have amplitude limited waveforms that tend to resemble square waves. The input terminals of logic device 14, typically an Exclusive-OR gate, are respectively connected to the output terminals of the clippers 10, 12. Logic device 14 compares the amplitudes of the intermediate signals, 42, 52 and provides an output signal 44 that maintains a logical "one" condition as long as the amplitude of only one of the intermediate signals has a non-zero magnitude (i.e., whenever the amplitudes of the intermediate signals disagree substantially in magnitude). Whenever the amplitudes of the intermediate signals agree in magnitude, logic device 14 provides an output signal having a logical "zero" condition. Although the logical "zero" state is herein characterized by a zero voltage, it may have any value of voltage that differs measureably from the voltage characterizing the logical "one" condition. If the input signals are not-in-phase, output signal 44 resembles a periodic rectangular wave having a "zero" condition corresponding to the duration of amplitude agreement of the input signals and a "one" condition corresponding to the duration of amplitude disagreement of the input waves. The period of the output signal equals one-half the period of the input signals. Filter 16 averages amplitude of output signal 44 to provide a continuous wave 45 having an amplitude proportional to the average pulse amplitude (i.e., the instantaneous pulse amplitude averaged over the period of the output signal) of output signal 44. The amplitude of the continuous wave 45 is dependent upon the duration of amplitude contrariety between the intermediate signals 42, 52 which is in turn dependent upon the extent of the phase difference between the input signals. The waveform describing output signal 44 and the amplitude of continuous wave 45 are substantially identical for $\phi$ and $360-\phi$ degrees of phase difference between the input signals. In order to facilitate observation of the amplitude of continuous wave 45, a voltage meter (not shown) with a scale running from 0 through 180 may be coupled to the output terminal of filter 16.

If the input signals 40, 50 are in-phase, the amplitudes of intermediate signals 42, 52 continuously coincide in magnitude, output signal 44 remains in a logical "zero" condition, and the amplitude of the continuous waveform 45 provided by filter 16 is at its minimum value. Conversely, if the input signals 40, 50 are 180° out-of-phase, the amplitudes of intermediate signals 42, 52 are in continuous contrariety, output signal 44 remains in a logical "one" condition, and the amplitude of the continuous waveform 45 provided by filter 16 is at its maximum value. If the phase difference between the input signals is between 0° and 180° of phase angle, the amplitude of intermediate signals 42, 52 agree during part of each period and disagree during the remainder of the period, output signal 44 resembles a rectangular wave in that it varies during each period between the logical "zero" and "one" conditions and the amplitude of continuous wave 45 is proportionally between its minimum and maximum value.

Gate 14 is unable to distinguish a leading waveform from a lagging waveform. This inability, coupled with the generation of output signals having an identical value for $\phi$ and $360-\phi$ degrees of phase difference, mandates the necessity of a second or sign output signal in order to prevent ambiguity in interpretation of the phase-angle output signal. Circuitry for providing a sign output signal has been designed under a convention wherein one of the intermediate signals 42, 52 is monitored for lead and lag while an internal waveform is used as a reference. In the circuits shown by FIGS. 1 and 2, intermediate signal 52 is monitored. Pulse-generator 18, connected to the output terminal of clipper 12, generates a single output pulse 53 in response to each substantial change of amplitude (e.g., "zero crossing") by intermediate signal 52. Due to the internal properties of pulse-generator 18, there is a slight delay between a change in the amplitude of intermediate signal 52 and the responsive output pulse 53. Output signal 44 and the responsive output pulse 53 are received on different input terminals of a bistable-multivibrator 20. Coincidence between delayed output pulse 53 and a non-zero segment of output signal 44 indicates that a substantial change in the amplitude of intermediate signal 52 has heralded the beginning of a duration of amplitude contrariety between input signals 40, 50, thereby causing the output of multivibrator 20 to assume a non-zero or "1" logic state.

Coincidence signifies that input signal 50 is leading input signal 40 by 180 degrees or less. Absence of coincidence indicates that a substantial amplitude change in intermediate signal 52 has initiated a duration of amplitude agreement, thereby allowing the output of multivibrator 20 to assume a "0" logic state. This signifies that input signal 50 lags input signal 40 by 180° or less. In order to easily determine the logic state of multivibrator 20, a low-voltage lamp (not shown) may be connected between the output terminal of multivibrator 20 and ground.

Figure 2:
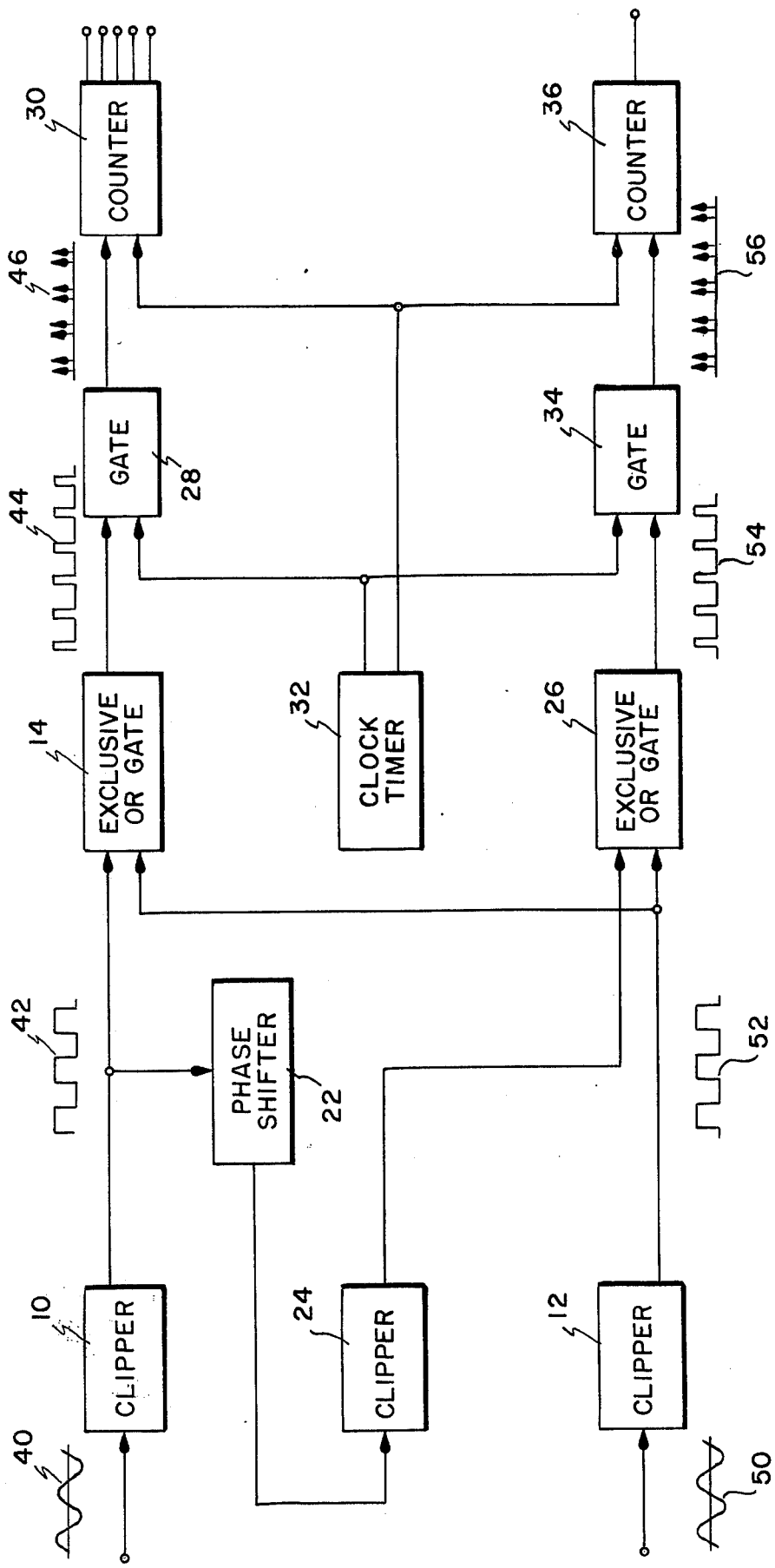
FIG. 2 is a diagrammatic view of an alternative to the embodiment of the invention shown in FIG. 1.

Referring now to FIG. 2, the embodiment of the invention shown differs from the circuit described by FIG. 1 in that it provides an ultimate signal which has a plurality of bits of variable logical condition rather than a continuous wave of variable amplitude. Clock-timer 32 generates a train of periodic clock-pulses at a frequency approximately one order of magnitude greater than the frequency of the input signals. Logic gate 28, coupled to the output terminals of logic gate 14 and clock-timer 32, is opened by reception of a non-zero segment of output signal 44 to allow passage of the periodic clock-pulses. Logic counter 30 is coupled to the output terminals of logic gate 28 and clock-timer 32. Counter 30 compares the occurrance of corresponding gated-periodic pulses passing through gate 28 and clock-pulses generated by timer 32. The results of the comparison determine the logical condition of a plurality of increasingly significant bits. If the input signals are in-phase, output signal 44 is in the logical "zero" condition and no gated-periodic pulses are allowed to pass through logic gate 28. Consequently, all the bits of counter 30 remain in a logical "zero" condition. If the input signals are 180 degrees out of phase, output signal 44 is continuously in a logical "one" condition and an uninterrupted train of gated-periodic pulses is allowed to pass through logic gate 28. Consequently, all bits of counter 30 remain in a logical "one" condition.

Intermediate signal 52, the monitored signal, is received at one terminal of gate 26 while the phase of intermediate signal 42 is shifted 90 degrees by phase shifter 22, limited in amplitude by clipper 24, and received at a second input terminal of gate 26. Gate 26, typically an Exclusive-OR gate, provides output signal 54 in response to a contrariety between the amplitudes of intermediate signal 52 and phase-shifted signal 42, the monitored and referenced signals respectively. Logic gate 34 has a pair of input terminals respectively connected to the output terminals of gate 26 and clock-timer 32. Gate 34 is opened during reception of a non-zero segment of output signal 54 to allow passage of the periodic clock-pulses generated by clock-timer 30. Counter 36 is connected to the output terminals of logic gate 34 and clock-timer 30. The output of counter 30 is dependent upon the logical condition of its most significant bit. If the ratio between the number of gated-periodic pulses allowed to pass through logic gate 34 during a period and the number of clock-pulses generated by timer 30 during the same period equals or exceeds fifty percent, the most significant bit is in a logical "one" condition to signify that the phase of input signal 50 leads input signal 40 by 180° or less. If the ratio is less than 50 percent, the most significant bit is in a logical "zero" condition to signify that the phase of input signal 50 lags input signal 40 by 180° or less.

It will be apparent that the invention embodied in the herein described circuits substantially eliminates the ability of noise or "jitter" to render an ultimate output meaningless. By comparing the agreement or contrariety of a selected geometric characteristic of the intermediate signals, such as their pulse amplitude or pulse duration, rather than detecting the existence or absence of coincidence between corresponding responsive pulses, a brief fluctuation in the value of the selected geometric characteristic is prevented from causing more than a similarily brief variation in the output signal. The occurrance of a significant error in the value of the ultimate output signal is substantially eliminated.

The circuitry described above generates an ultimate output signal (e.g., a continuous wave or a plurality of digital bits) which has the same value for $\phi$ degrees of phase difference as for $360-\phi$ degrees of phase difference. When the input signals are in phase (i.e., either 0° or 360° of phase difference) the magnitude output signal has its lowest value. Even though noise may cause "jitter" in a signal, the magnitude output signal will remain unambiguously at its lowest value as long as the input signals are in phase.

The foregoing embodiments are merely illustrative of the basic principles of the invention. Obviously, numerous modifications and variations of the present invention are possible in light of the above teachings. For example, although the waveforms of the input signals shown in FIGS. 1 and 2 are sine waves, embodiments of the invention are able to measure the phase difference between any pair of equal period, symmetrical input signals. By way of illustration, and not by the way of limitation, an input signal may also be imprecisely geometrically described as irregular, sawtooth, triangular, or square. It is not necessary that the input waveforms have geometrically similar waveforms. If the input signals are squarewaves of equal amplitude, clippers 10 and 12 may be eliminated.

The foregoing embodiments were described as providing an output signal in response to the duration of amplitude contrariety, it should be apparent that the circuits can likewise be designed to generate an output signal in response to any manifestation of phase difference such as amplitude agreement or polarity agreement or disagreement.

Typically, Exclusive-OR gate 14, a logic operator designed to compare the logic condition of input signals, is one segment of a "quad" such as a National Semiconductor model CD4030. Gate 14 could also be an Exclusive-NOR gate. A three-pole approximately Butterworth filter is typical of filter 16. Logic gates 28 and 34 are typically either AND gates or NAND gates. Multivibrator 20 is typically either a type "D" or "Data" or a type "J-K".

It is therefore to be understood that within the scope of the appended claims, the invention may be practiced otherwise than as specifically described herein.

What is claimed as new and desired to be secured by Letters Patent of the United States is:

1. A circuit for measuring phase difference between a first input signal and a second input signal comprising:
   first clipping means for limiting the amplitude of said first input signal and providing a first intermediate signal;
   second clipping means for limiting the amplitude of said second input signal and providing a second intermediate signal;
   first logic means coupled to said first and said second clipping means for receiving said first and said second intermediate signal and providing a first output signal having a logical "one" condition whenever said first and said second intermediate signals are of different amplitude and a logical "zero" condition whenever said first and said second intermediate signals are of the same amplitude whereby the duration of said logical "one" condition is proportional to the extent of said phase difference;
   a pulse generator coupled to said second clipping means for providing an output pulse in response to a substantial change in amplitude by said second intermediate signal;
   a bistable-multivibrator coupled to said first logic means and to said pulse generator for receiving said first output signal and said output pulse and maintaining a logical "one" sign state whenever said output pulse coincides with said logical "one" condition;
   whereby said logical "one" sign state indicates that said second input signal leads said first input signal by not more than 180° of phase angle and said logical "zero" sign state indicates that said first input signal leads said second input signal by not more than 180° of phase angle.

2. The circuit described in claim 1 further comprising a filter coupled to said first logic means and adapted to receive said first putput signal for providing a continuous waveform having an amplitude proportional to the average pulse amplitude of said first output signal.

3. The circuit described in claim 1 comprising:
   a clock timer for generating clock-pulses;
   a first gating means coupled to said first logic means and said clock-timer for receiving said output signal and said clock-pulses and providing a plurality of gated-periodic pulses during coincidence of the logical "one" condition of said output signal with said clock-pulses.

4. The circuit described in claim 3 comprising:
   a counter coupled to said first gating means and said clock-timer for receiving said periodic pulses and said clock-pulses and providing a plurality of logical bits, each bit having a variable condition, whereby the condition of each bit is dependent upon the ratio between the number of gated-periodic pulses received during a period and the number of clock-pulses received during the same period.

5. The circuit described in claim 1 wherein said first logic means comprises an Exclusive-OR gate.

6. The circuit described in claim 1 wherein said first logic means comprises an Exclusive-NOR gate.

7. A circuit for measuring phase difference between a first input signal and a second input signal comprising:

first clipping means for limiting the amplitude of said first input signal and providing a first intermediate signal;

second clipping means for limiting the amplitude of said second input signal and providing a second intermediate signal;

first logic means coupled to said first and said second clipping means for receiving said first and said second intermediate signal and providing a first output signal having a logical "one" condition whenever said first and said second intermediate signals are of different amplitude and a logical "zero" condition whenever said first and said second intermediate signals are of the same amplitude whereby the duration of said logical "one" condition is proportional to the extent of said phase difference;

shifting means coupled to said first clipping means for receiving said first intermediate signal and providing a shifted intermediate signal differing in phase from said first intermediate signal;

third clipping means coupled to said shifting means for limiting the amplitude of said shifted intermediate signal and providing a third intermediate signal;

second logic means coupled to said second clipping means and said third clipping means for receiving said second intermediate signal and said third intermediate signal and providing a second output signal having a logical "one" condition whenever said second intermediate signal and said third intermediate signal are of different amplitude and a logical "zero" condition whenever said second intermediate signal and said third intermediate signal are of the same amplitude;

a clock-timer for generating clock-pulses;

a second gating means coupled to said second logic means and said clock-timer for receiving said second output signal and said clock-pulses and providing a plurality of gated-periodic pulses during coincidence of the logical "one" condition of said second output signal with said clock-pulses; and, a logic counter coupled to said second gating means and said clock-timer and having a plurality of increasingly significant bits, for receiving said gated-periodic pulses and said clock-pulses and maintaining a logical "one" condition in the most significant of said bits whenever the ratio between the number of gated-periodic pulses received during a period and the number of clock-pulses received during the same period is equal to or greater than 50 percent and maintaining a logical "zero" condition in the most significant of said bits whenever the ratio between the number of gated-periodic pulses received during a period and the number of clock-pulses received during the same period is less than 50 percent;

whereby said logical "one" condition in the most significant of said bits signifies that said second input signal leads said first input signal by not more than 180° of phase angle and said logical "zero" condition in the most significant of said bits signifies that said first input signal leads said second input signal by not more than 80° of phase angle.

8. The circuit described in claim 7 further comprising a filter coupled to said first logic means and adapted to receive said first output signal for providing a continuous waveform having an amplitude proportional to the average pulse amplitude of said first output signal.

9. The circuit described in claim 7 comprising:
a first gating means coupled to said first logic means and said clock-timer for receiving said output signal and said clock-pulses and providing a plurality of gated-periodic pulses during coincidence of the logical "one" condition of said output signal with said clock-pulses.

10. The circuit described in claim 9 comprising:
a counter coupled to said first gating means and said clock-timer for receiving said periodic pulses and said clock-pulses and providing a plurality of logical bits, each bit having a variable condition, whereby the condition of each bit is dependent upon the ratio between the number of gated-periodic pulses received during a period and the number of clock-pulses received during the same period.

11. The circuit described in claim 7 wherein said first logic means comprises an Exclusive-OR gate.

12. The circuit described in claim 7 wherein said first logic means comprises an Exclusive-NOR gate.

13. A circuit for converting a phase disagreement between a first and a second substantially symmetric signal of equal period into a continuous wave comprising:

a pair of operational amplifiers respectively receiving said first and second signals, each amplifier developing a square wave having the same phase as the respective signal received but limited in instantaneous amplitude to a previously selected value;

gating means receiving the square waves developed by said operational amplifiers for producing a rectangular pulse equal in duration to the phase disagreement of the square waves;

filter means receiving said rectangular pulse for developing a continuous wave having an amplitude equal to the time average of said rectangular pulse amplitude;

a pulse generator electrically connected to either of said operational amplifiers for producing an output clock pulse in response to any substantial change in amplitude of the square wave developed by the selected amplifier; and a bistable-multivibrator receiving said rectangular pulse and said clock pulse for producing a continuous wave only when said clock pulse coincides with said rectangular pulse.

14. A circuit for supplying a plurality of output signals in dependence upon phase difference between a first and a second geometrically similar waveform, each waveform having an equal period and a variable amplitude comprising:

a first clipper circuit having an input and an output terminal, said input terminal adapted to receive said first waveform, for generating a first rectangular pulse having a period equal to the period of said first waveform, a selected non-zero amplitude when the amplitude of said first waveform is greater than zero, and a zero amplitude when the amplitude of said first waveform is less than or equal to zero;

a second clipper circuit having an input and an output terminal, said input terminal adapted to receive said second waveform, for generating a second rectangular pulse having a period equal to the period of said waveform, a selected non-zero amplitude when the amplitude of said second waveform is greater than zero, and a zero amplitude when the amplitude of said second waveform is less than or equal to zero;

logic means having a first input terminal connected in series with the output terminal of said first clipper and adapted to receive said first rectangular pulse, a second input terminal connected in series with the output terminal of said second clipper and adapted to receive said second rectangular pulse, and an output terminal, for generating an intermediate waveform having a selected non-zero geometric characteristic when the amplitude of said first rectangular waveform disagrees with the amplitude of said second rectangular waveform and a zero geometric characteristic when the amplitude of said first rectangular waveform agrees with the amplitude of said second rectangular waveform;

a clock-timer for generating clock-pulses;

gating means coupled to said logic means and said clock-timer for receiving said intermediate signal and said clock-pulses respectively, and providing a plurality of gated-periodic pulses during coincidence of the non-zero geometric characteristic of the intermediate signal with said clock-pulses; and, a logic counter coupled to said gating means and said clock-timer and having a plurality of increasingly significant bits, for receiving said gated-periodic pulses and said clock-pulses and maintaining a logical "one" condition in the most significant of said bits whenever the ratio between the number of gated-periodic pulses received during a period and the number of clock-pulses received during the same period is equal to or greater than 50 percent and maintaining a logical "zero" condition in the most significant of said bits whenever the ratio between the number of gated-periodic pulses received during a period and the number of clock-pulses received during the same period is less than 50 percent;

whereby said logical "one" condition in the most significant of said bits signifies that said second input signal leads said first input signal by not more than 180° of phase angle and said logical "zero" condition in the most significant of said bits signifies that said first input signal leads said second input signal by not more than 180° of phase angle.

15. The circuit described in claim 14 wherein said geometric characteristics comprises the pulse amplitude of said input waveform.

16. The circuit described in claim 14 further comprising:

a pulse generator electrically connected to said second clipper circuit for producing an output pulse in response to any substantial change in amplitude of the square wave developed by the second clipper circuit; and a bistable-multivibrator receiving said rectangular pulse and said clock pulse for producing a continuous wave only when said clock pulse coincides with said rectangular pulse.

* * * * *